(12) United States Patent
Leirer et al.

(10) Patent No.: US 11,177,233 B2
(45) Date of Patent: Nov. 16, 2021

(54) SOLDER PADS OF VARIABLE THICKNESS IN AN OPTOELECTRONIC SEMICONDUCTOR CHIP, ON A CONNECTION SUBSTRATE FOR MOUNTING A SEMICONDUCTOR CHIP, METHOD OF PRODUCING AN OPTOELECTRONIC COMPONENT, AND OPTOELECTRONIC COMPONENT HAVING THE SOLDER PADS

(71) Applicant: OSRAM OLED GmbH, Regensburg (DE)

(72) Inventors: Christian Leirer, Friedberg (DE); Martin Rudolf Behringer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 134 days.

(21) Appl. No.: 16/348,602

(22) PCT Filed: Nov. 10, 2017

(86) PCT No.: PCT/EP2017/078899
§ 371 (c)(1),
(2) Date: May 9, 2019

(87) PCT Pub. No.: WO2018/087297
PCT Pub. Date: May 17, 2018

(65) Prior Publication Data
US 2021/0057369 A1    Feb. 25, 2021

(30) Foreign Application Priority Data

Nov. 11, 2016   (DE) .......................... 102016121631.3

(51) Int. Cl.
*H01L 23/00* (2006.01)
*H01L 25/16* (2006.01)
(Continued)

(52) U.S. Cl.
CPC .............. *H01L 24/29* (2013.01); *H01L 24/05* (2013.01); *H01L 24/32* (2013.01); *H01L 25/167* (2013.01);
(Continued)

(58) Field of Classification Search
None
See application file for complete search history.

(56) References Cited

U.S. PATENT DOCUMENTS 5,640,052 A * 6/1997 Tsukamoto ............. H01L 24/13
257/781
7,569,935 B1 * 8/2009 Fan ....................... H05K 3/3436
257/737
(Continued)

FOREIGN PATENT DOCUMENTS

JP   2003-031895 A   1/2003

*Primary Examiner* — Michelle Mandala
*Assistant Examiner* — Jordan M Klein
(74) *Attorney, Agent, or Firm* — DLA Piper LLP (US)

(57) ABSTRACT

An optoelectronic semiconductor chip includes a rear side with a center and with two contact points for electrical contacting of the semiconductor chip, the contact points being spaced apart from one another, and two solder pads arranged on the contact points, wherein the center is located in a region between the contact points, the solder pads protrude from the rear side and are exposed, and on average, the solder pads are thicker further away from the center than in the vicinity of the center or vice versa.

17 Claims, 7 Drawing Sheets

(51) Int. Cl.
*H01L 33/48* (2010.01)
*H01L 33/62* (2010.01)

(52) U.S. Cl.
CPC ............ *H01L 33/486* (2013.01); *H01L 33/62* (2013.01); *H01L 2224/04026* (2013.01)

(56) References Cited

U.S. PATENT DOCUMENTS

| | | |
|---|---|---|
| 9,960,137 B1* | 5/2018 | Huang .................... H01L 24/81 |
| 2007/0217476 A1 | 2/2007 | Yoshikawa et al. |
| 2012/0097972 A1 | 4/2012 | Sugizaki et al. |
| 2014/0124917 A1 | 5/2014 | Lee et al. |
| 2014/0145324 A1* | 5/2014 | Uchibori ................. H01L 22/20 |
| | | 257/737 |
| 2015/0001740 A1 | 1/2015 | Shi et al. |
| 2018/0122763 A1* | 5/2018 | Chow .................... H01L 24/16 |

* cited by examiner

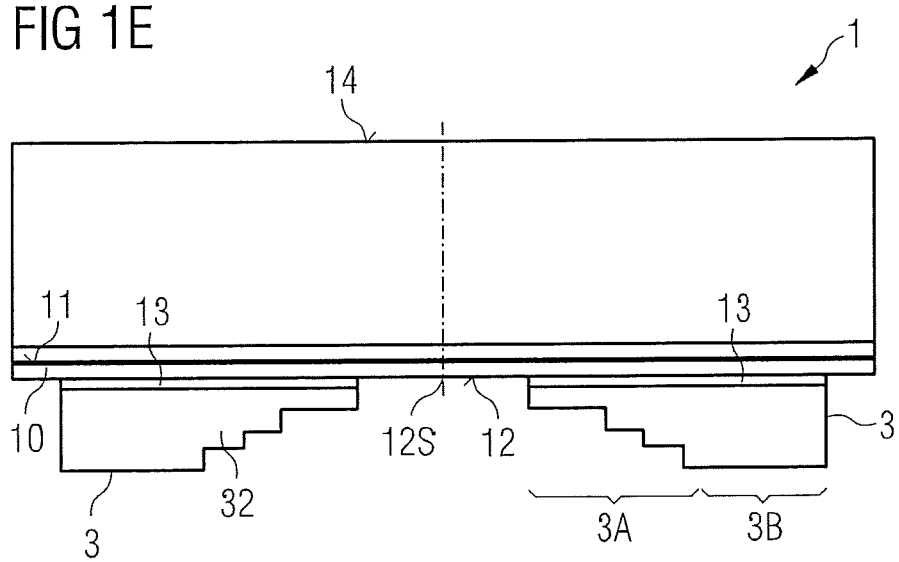
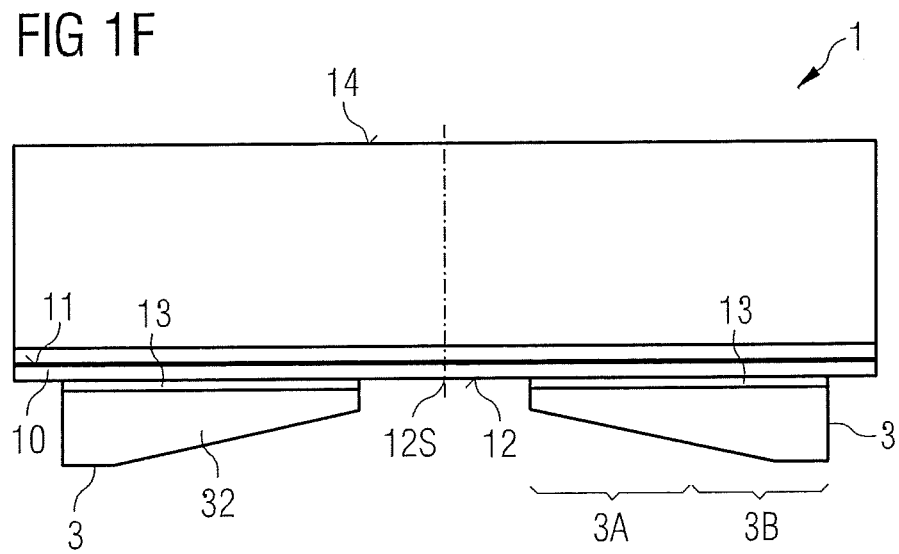

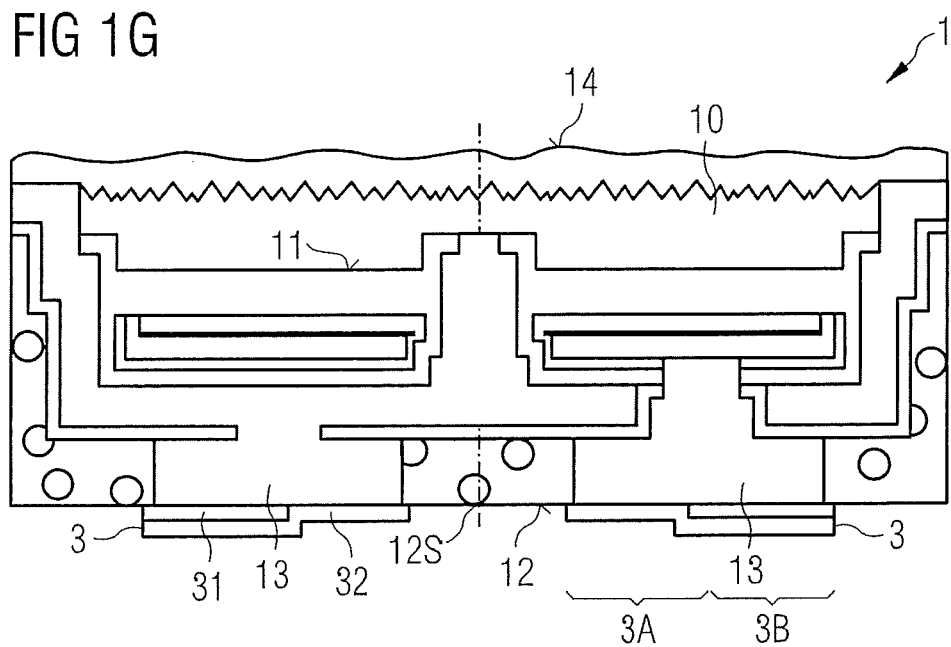
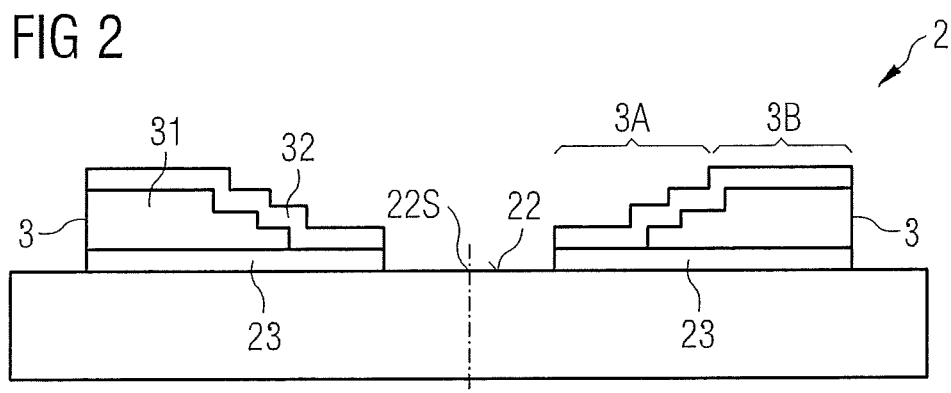

SOLDER PADS OF VARIABLE THICKNESS IN AN OPTOELECTRONIC SEMICONDUCTOR CHIP, ON A CONNECTION SUBSTRATE FOR MOUNTING A SEMICONDUCTOR CHIP, METHOD OF PRODUCING AN OPTOELECTRONIC COMPONENT, AND OPTOELECTRONIC COMPONENT HAVING THE SOLDER PADS

TECHNICAL FIELD

This disclosure relates to an optoelectronic semiconductor chip, a connection carrier for mounting a semiconductor chip, a method of manufacturing an optoelectronic component and an optoelectronic component.

BACKGROUND

There is a need to provide an optoelectronic semiconductor chip or a connection carrier in which the solder connections are reliably formed when the semiconductor chip is soldered onto a connection carrier as well as a method of manufacturing a component with such solder connections and a component with such solder connections.

SUMMARY

We provide an optoelectronic semiconductor chip including a rear side with a center and with two contact points for electrical contacting of the semiconductor chip the contact points being spaced apart from one another, and two solder pads arranged on the contact points, wherein the center is located in a region between the contact points, the solder pads protrude from the rear side and are exposed, and on average, the solder pads are thicker further away from the center than in the vicinity of the center or vice versa.

We provide a connection carrier for mounting a semiconductor chip including an upper side with two adjacent connection points for electrical contacting of the semiconductor chip, the connection points being spaced apart from one another, a center on the upper side between the connection points, and two solder pads arranged on the connection points, wherein the solder pads protrude from the upper side and are exposed, on average, the solder pads are thicker further away from the center than in the vicinity of the center or vice versa.

We provide a method of manufacturing an optoelectronic component including providing an optoelectronic semiconductor chip and/or a connection carrier, wherein the semiconductor chip has two contact points on a rear side, and the connection carrier has at least two connection points on an upper side; applying solder pads to the connection points and/or to the contact points, wherein a thickness of the solder pads related to a normal of the upper side or the rear side is varied over the lateral expansion of the solder pads so that the thickness of the solder pads is adapted to a curvature of the rear side and the upper side occurring in a subsequent soldering process, and in regions in which, due to the later curvature, the expected distance between the rear side and the upper side is larger or smaller, the thickness of the solder pads is also selected to be correspondingly larger or smaller.

We provide an optoelectronic component including a semiconductor chip having a rear side and two contact points for electrical contacting of the semiconductor chip, the contact points being arranged on the rear side and spaced apart from one another, and a connection carrier having an upper side and two connection points for electrical contacting of the semiconductor chip the connection points being arranged on the upper side and spaced apart from one another, wherein the semiconductor chip is soldered onto the connection carrier, the contact points electrically and mechanically connect to assigned connection points via solder pads, the rear side and/or the upper side have a curvature with a radius of curvature of at least 1 cm so that the distance between the upper side and the rear side monotonously increases or decreases in the direction away from a center of the rear side, the solder pads are in direct mechanical contact with the connection points and the contact points, the solder pads wet at least 80% of the connection points and the contact points, and the thickness of the solder pads increases or decreases monotonously in the direction away from the center of the rear side according to the distance.

BRIEF DESCRIPTION OF THE DRAWINGS

FIGS. 1A to 1G show different examples of a semiconductor chip in a cross-sectional view.

FIG. 2 shows an example of a connection carrier in a cross-sectional view.

Figure 1A:
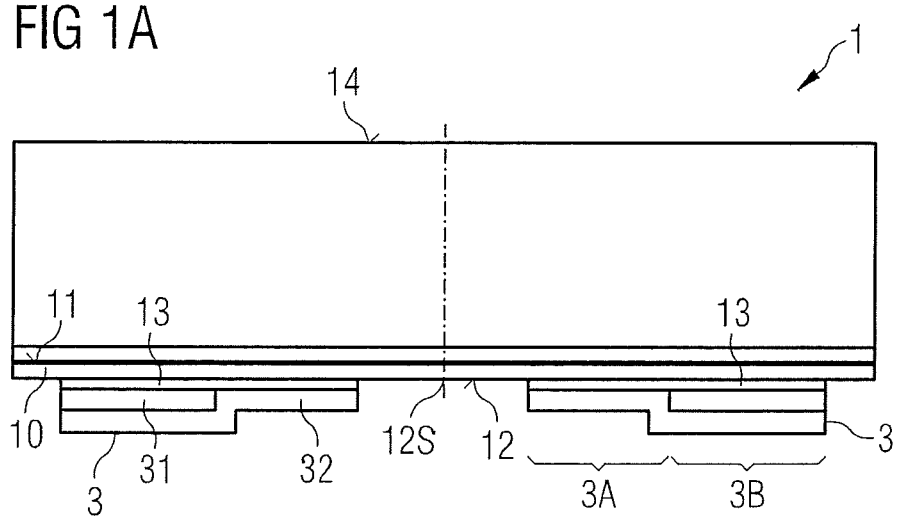

REFERENCE NUMBER LIST 1 optoelectronic semiconductor chip
2 connection carrier
3 solder pads
3A first region
3B second region
10 semiconductor layer sequence
11 active layer
12 rear side of the semiconductor chip
12S center of the rear side
13 contact points
22 Upper side of the connection carrier
22S center
23 connection points
31 metal structure
32 solder metal
100 optoelectronic component

DETAILED DESCRIPTION

Our optoelectronic semiconductor chip may comprise a rear side with a center and with exactly two or at least two spaced apart contact points. The contact points may be used for electrical contacting of the semiconductor chip. For example, the contact points are metallic.

The two contact points preferably have different polarities. One contact point, for example, is an anode and the other contact point a cathode.

The optoelectronic semiconductor chip is preferably a surface-mountable optoelectronic semiconductor chip, for example, a thin film chip or a sapphire chip or a flip chip. In particular, the semiconductor chip is an LED chip.

Solder pads may be arranged on the two contact points. For example, the solder pads completely cover the contact points. Each solder pad can be uniquely assigned to a contact point. The solder pads are preferably also metallic. During an intended soldering process, the solder pad partially or completely melt.

A solder pad is a solder structure or solder metallization usually used for mechanical and electrical connection of two electrical components. The solder pads can be formed in one piece or can consist of two or more sections of different materials. Each solder pad is preferably designed to be continuous, preferably simply-connected.

The center of the rear side may be located in the region between the contact points. For example, the center forms a midpoint or center of gravity on the rear side. The contact points and/or solder pads can be arranged symmetrically with respect to the center, for example, point symmetrically.

The solder pads may protrude from the rear side and may be exposed. The solder pads are therefore preferably freely accessible on the rear side and have not yet been soldered to a connection carrier.

On average, the solder pads may be deliberately thicker further away from the center than in the vicinity of the center. But also, the opposite case is possible, where on average, the solder pads are thinner further away from the center than near the center. The thickness of the solder pads is preferably measured in the direction perpendicular to the rear side. Particularly preferably, only the part of the solder pad protruding from the rear side contributes to the thickness. "Deliberately" means that the variation of the thickness in a direction away from the center is not caused by random processes, for example, due to different degrees of wetting or surface tension effects, but is set intentionally and in a predefined manner.

In other words, in a plan view of the rear side, each solder pad consists of two equally sized regions, with each point of the first region being closer to the center than each point of the second region. The mean thickness of the solder pads in the second region is then greater than the mean thickness in the first region or vice versa. For example, each of the smaller of the two mean thicknesses is at most 90% or at most 80% or at most 70% or at most 60% or at most 50% or at most 40% or at most 30% of the larger of the two mean thicknesses. In absolute terms, the thickness averaged over the first region deviates, for example, by at least 1 µm or at least 2.5 µm or at least 5 µm or at least 7.5 µm from the thickness averaged over the second region. As an alternative or in addition, the mean thickness in the first region deviates from the mean thickness in the second region by, for example, at most 15 µm or at most 10 µm or at most 7.5 µm or at most 5 µm. In the two regions, for example, the mean thicknesses are each selected to be at least 1 µm or at least 2.5 µm or at least 5 µm or at least 7.5 µm. Alternatively or additionally, the mean thickness in each of the two regions is at most 10 µm or at most 7.5 µm or at most 5 µm.

The solder pads form a two-dimensional geometric surface, for example, a square or a rectangle or a circle or an ellipse when viewed from above. The center of gravity of these surfaces will then deviate from the center of gravity of the volume of the solder pad due to the thickness variation so that the center of gravity of the volume is closer to the center of the rear side than the center of gravity of the surface or vice versa. For example, in a plan view of the rear side, the center of gravity of the volume is at least 0.5 µm or at least 1 µm or at least 2 µm or at least 5 µm closer to the center of the rear side or further away from the center of the rear side than the center of gravity of the surface.

Preferably, the thickness of each solder pad increases or decreases in a direction away from the other solder pad. For example, in a plan view, the solder pads have essentially parallel edges facing each other. In a plan view, only electrically insulating material is preferably arranged between the two parallel edges. The edges limit the solder pads each in a lateral direction, parallel to the rear side. Preferably, the thicknesses of each solder pad increase or decrease in a direction crosswise or perpendicular to these edges. In each instance, the center of gravity of the volume is, for example, further away from these edges or closer to these edges than center of gravity of the surface.

The optoelectronic semiconductor chip may have a rear side with a center and two contact points for electrical contacting of the semiconductor chip, the contact points being spaced apart from one another. Two solder pads are arranged on the contact points, with the center located in the region between the contact points and the solder pads protruding from the rear side and being exposed. On average, the solder pads are thicker further away from the center than in the vicinity of the center or vice versa.

We discovered that when soldering semiconductor chips, for example, LED chips, especially semiconductor chips in flip-chip geometry or in thin-film geometry, their thermodynamics cause them to bend during the soldering process. Especially with the soldering method of eutectic thin-film soldering, the high required temperatures of approx. 300° C. in connection with thin solder pads of thicknesses of 1 µm to 10 µm can lead to the fact that, due to the component deflection, no complete solder connection to the connection carrier takes place.

One way to avoid this problem is to make the solder pads very thick, for example, with thicknesses above 20 µm or above 30 µm. However, this is not particularly attractive for reasons of material costs. In a paste soldering process, on the other hand, a lot of material is used by default so that the problem mentioned above does not occur.

We make use of the idea of forming solder pads with a variable thickness. The solder pads are formed such that the difference in thickness of the solder pads compensates for or corresponds to deflection of the semiconductor chip or the connection carrier that is to be expected later during soldering or at the solidification point of the solder. This provides a particularly reliable solder connection between the semiconductor chip and the connection carrier.

The thickness of the solder pads varies in a predetermined manner across the lateral extent of the solder pads. The variation of the thickness is adapted to the expected curvature of the rear side and/or the connection carrier when soldering the semiconductor chip onto a connection carrier. This is realized by the fact that the thickness of the solder pads is larger in regions where the distance between the rear side and the connection carrier will be larger due to the expected curvature. In those regions where the distance will be smaller due to the curvature, the thickness of the solder pads is correspondingly smaller. The lateral direction is a direction parallel to the rear side.

The curvature of the rear side of the semiconductor chips can be determined by experiments or simulations. Typically, semiconductor chips with lateral expansion in the millimeter range are expected to have a curvature or deflection of a few micrometers, for example, 1 µm to 10 µm. This means that the radius of curvature of the semiconductor chip is typically 1 cm to 10 m. The solder pads can be adapted according to this knowledge.

The optoelectronic semiconductor chip is thus characterized in particular by the fact that the thickness of the solder pads is specifically varied and predominantly increases or decreases in the direction of the center of the rear side. "Predominantly" means, for example, that in at least 60% or at least 70% or at least 80% of the area of the solder pads, when viewed in a plan view of the rear side, the thickness of the solder pads increases monotonously or decreases monotonously towards the center.

At least one of the solder pads, preferably both solder pads, may comprise a metal structure and a solder metal or consist of a metal structure and a solder metal. The metal structure is arranged between a layer of solder metal and the rear side. The layer of solder metal is preferably contiguous, for example, simply connected, and has a constant thickness within the limits of manufacturing tolerance.

The metal structure below the solder metal preferably has a melting temperature higher than the melting temperature of the solder metal. Preferably, the metal structure does not melt during the soldering process. For example, the melting temperature of the metal structure is at least 400° C. or at least 600° C. or at least 1000° C. The solder metal, on the other hand, should melt during the intended soldering process. For example, the melting temperature of the solder metal is at most 350° C. or at most 300° C.

For example, the metal structure comprises or consists of Ni or Cu or Ag or Au or an alloy of these materials. For example, the solder metal comprises or consists of AuSn or AgSn or NiSn or Au. For example, the thickness of the layer of the solder metal is at least 1 μm or at least 2 μm or at least 5 μm. Alternatively or additionally, the thickness of the layer of the solder metal is at most 10 μm or at most 7.5 μm or at most 5 μm.

The metal structure preferentially produces the thickness variation of the solder pad. For example, the solder metal is formed as a layer with a constant thickness within the limits of manufacturing tolerance. The layer of solder metal is preferably placed over the metal structure on the rear side, whereby the metal structure is arranged and/or shaped such that the entire solder pad has a thickness variation.

The metal structure may be a layer covering the rear side in the second region of the solder pads and having a constant thickness within the limits of manufacturing tolerance. The metal structure can be contiguous, in particular, simply connected. The metal structure can extend over the entire second region or can only partially cover it. The thickness of the metal structure, for example, is at least 1 μm or at least 2 μm or at least 5 μm. Alternatively or additionally, the thickness of the metal structure is at most 20 μm or at most 15 μm or at most 10 μm or at most 5 μm.

The first region of the solder pad may be free of the metal structure. Alternatively, the first region can also be covered by the metal structure to a lesser degree than the second region. This means that, in a plan view of the rear side, the metal structure occupies a smaller area in the first region than in the second region.

The layer of solder metal may extend over the first region and the second region. The layer of the solder metal preferably completely covers the first region and the second region of the solder pads and is, for example, formed in a simply connected manner.

The two-layer structure with the metal structure and the solder metal ensures that the solder pad is thicker in the region of the metal structure than in regions free of the metal structure. Furthermore, the high melting temperature of the metal structure prevents the shape of the solder pad, especially the specifically adjusted and varying thickness, from being lost during the soldering process.

The metal structure may be staircase-shaped so that the thickness of metal structure increases or decreases stepwise in the lateral direction and has at least two or three or four or five steps. In particular, the metal structure may have or consist of several superimposed metal layers offset in a lateral direction.

The thickness of the metal structure in the region of each step may be constant within the limits of manufacturing tolerance. For example, the thickness of the metal structure in the region of each step is not more than 90% or not more than 80% or not more than 70% or not more than 60% or not more than 50% of the thickness of the metal structure in the region of the next larger or next higher or next thicker step.

Depending on the number and thickness of the steps within the metal structure, a more or less continuous increase in the thickness of the metal structure can be achieved. With the layer of solder metal placed on top, solder pads can be formed whose thickness increases more or less continuously and which are adapted to the expected curvature of the semiconductor chip and/or the connection carrier.

The thickness of the metal structure may increase or decrease continuously in the lateral direction. In particular, in this example, the metal structure is not staircase-shaped, i.e. it does not have any steps within the limits of manufacturing tolerance.

At least one of the solder pads may be staircase-shaped so that the thickness of the solder pad increases or decreases stepwise in the lateral direction and the solder pad has at least two steps. The ratios of the steps to each other can be selected according to the above explanations for the steps of the metal structure.

The thickness of the solder pad of at least one solder pad may increase or decrease continuously in the lateral direction, i.e. there are no steps within the limits of manufacturing tolerance.

At least one of the solder pads may be formed of a solder metal. This means that the solder pad may consist of the solder metal and has no additional metal structure with a higher melting temperature. Rather, the solder pad consists entirely of a solder metal that melts at a temperature occurring during the soldering process.

Each solder pad may have two or more spaced apart metal structures as described above. The layer of solder metal laid over the metal structures is preferably simply connected.

In addition, a connection carrier for mounting a semiconductor chip, for example an optoelectronic semiconductor chip, is specified.

The connection carrier may have an upper side with two adjacent, spaced apart connection points for electrical contacting of the semiconductor chip. The connection points are assigned to a common semiconductor chip after mounting of the semiconductor chip. The connection points preferably have different polarities. One connection point, for example, is an anode and the other connection point, for example, is a cathode.

In addition, the connection carrier has a center on the upper side arranged between the connection points. The center can, but does not have to, form a center of the entire upper side. Preferably, the center forms a symmetry point between the two connection points with respect to which the two connection points are arranged point-symmetrically on the upper side.

Two solder pads are arranged on the connection points, wherein the solder pads protrude from the upper side and are exposed. On average, the solder pads are deliberately thicker further away from the center than in the vicinity of the center or vice versa.

The solder pads on the connection carrier can be designed according to the solder pads of the semiconductor chip described above. All features of the solder pads of the semiconductor chip are therefore also disclosed for the solder pads of the connection carrier and vice versa. In particular, the solder pads on the connection carrier fulfill the same purpose as the solder pads on the semiconductor chip described above, namely to compensate for curvatures occurring during the soldering process. Depending on the application or manufacturing process, it can be advantageous to form solder pads of varying thickness on the connection carrier or on the semiconductor chip. It is also possible to form such solder pads with specifically varied thickness both on the connection carrier and on the semiconductor chip.

If the solder pads have a metal structure and a solder metal, the metal structure is preferably located between the upper side and the solder metal.

In our method of manufacturing an optoelectronic component, an optoelectronic semiconductor chip and/or a connection carrier are provided with solder pads and then soldered together. The solder pads are preferably designed like the solder pads described above. All features disclosed for the solder pads described above are therefore also disclosed for the solder pads of the method and vice versa.

The method of manufacturing an optoelectronic component may comprise a step A) in which an optoelectronic semiconductor chip and/or a connection carrier are provided. The semiconductor chip has two contact points, especially two metallic contact points, on a rear side. The connection carrier has at least two connection points on an upper side, in particular, two metallic connection points.

In a step B), solder pads are applied to the connection points and/or to the contact points, whereby a thickness of the solder pads related to a normal of the upper side or to the rear side is varied over the lateral expansion of the solder pads. The lateral expansion is an expansion parallel to the upper side or the rear side.

The thickness of the solder pads is varied such that the thickness of the solder pads is adapted to the curvature of the rear side and the upper side that occurs in a later soldering process. In regions where the expected distance between the rear side and the upper side is larger or smaller due to the later curvature, the thickness of the solder pads is also chosen to be correspondingly larger or smaller.

In a step C) of the method, the semiconductor chip and the connection carrier electrically and mechanically connect to each other via a soldering process in which the rear side and/or the upper side are curved. When connecting, a contact point is uniquely assigned to each connection point. The contact points electrically and mechanically connect to the connection points via the solder pads. Both the contact points and the connection points directly and mechanically contact the solder pads after the soldering process.

Steps A) to C) may be executed in the specified order.

Our optoelectronic component may be manufactured using the above-mentioned method. All features of the method are therefore also disclosed for the optoelectronic component and vice versa.

The optoelectronic component may comprise a semiconductor chip with a rear side and two spaced apart contact points on the rear side for electrical contacting of the semiconductor chip. Furthermore, the component comprises a connection carrier with an upper side and two connection points arranged on the upper side and spaced apart from one another for contacting of the semiconductor chip. The semiconductor chip is soldered onto the connection carrier. The contact points electrically and mechanically connect with assigned connection points via solder pads. The solder pads directly and mechanically contact the contact points as well as the connection points.

The rear side of the semiconductor chip and/or the upper side of the connection carrier have a curvature with a radius of curvature of at least 1 cm or of at least 10 cm or of at least 1 m. Alternatively or additionally, the radius of curvature is at most 10 m or at most 1 m. Due to the curvature of the rear side or upper side, the distance between the upper side and the rear side may increase or decrease monotonously in the direction away from a center of the rear side.

The solder pads directly and mechanically contact the connection points and the contact points. Furthermore, the solder pads cover or wet the connection points and the contact points by at least 80% or at least 90% or at least 95%. The thickness of the solder pads may increase or decrease monotonously in the direction away from the center of the rear side according to the distance.

In the following, an optoelectronic semiconductor chip described herein, a connection carrier described herein, a method described herein and a component described herein are explained in more detail with reference to the drawings by examples. Like reference numerals indicate like elements in the figures. However, the size ratios involved are not to scale, individual elements may rather be illustrated with an exaggerated size for a better understanding.

FIG. 1A shows a first example of a semiconductor chip 1 in a cross-sectional view. The semiconductor chip 1 comprises a semiconductor layer sequence 10 arranged on a substrate. For example, the semiconductor chip 1 is a sapphire chip where the substrate is sapphire. The semiconductor layer sequence 10, for example, is based on GaN. The semiconductor layer sequence 10 comprises an active layer 11 in which electromagnetic radiation such as blue light or UV light is generated during intended operation of the semiconductor chip 1.

Further, the semiconductor chip 1 comprises a radiation exit surface 14 formed by the substrate, and an opposite rear side 12. The rear side 12 comprises a center 12S through which the cross-sectional plane for the shown cross-sectional view extends. On the rear side 12, the semiconductor chip 1 comprises contact points 13 formed, for example, from a metal such as silver or gold or platinum.

Solder pads 3 are attached to the contact points 13. The solder pads 3 completely cover the contact points 13. The solder pads 3 are each divided into a first region 3A and a second region 3B, wherein, in a plan view to the rear side 12, each point of the first region 3A lies closer to the center 12S than the points of the second region 3B (see especially FIGS. 4A to 4E). The regions 3A and 3B have the same surface area when viewed in a plan view of the rear.

On average, a thickness of solder pads 3 further away from center 12S is chosen to be larger than near center 12S. The mean thickness of solder pads 3 in the first region 3A is at most 70% of the mean thickness in the second region 3B. This is achieved by the fact that the solder pads 3 in the second region 3B comprise a metal structure 31, particularly a metal layer, for example, of nickel or copper or gold or silver. The metal structure 31 covers the second region 3B to a higher degree than the first region 3A. A solder metal 32 in the form of a layer is placed on top of the metal structure 31. The solder metal 32 completely covers both the first region 3A and the second region 3B.

Figure 1B:
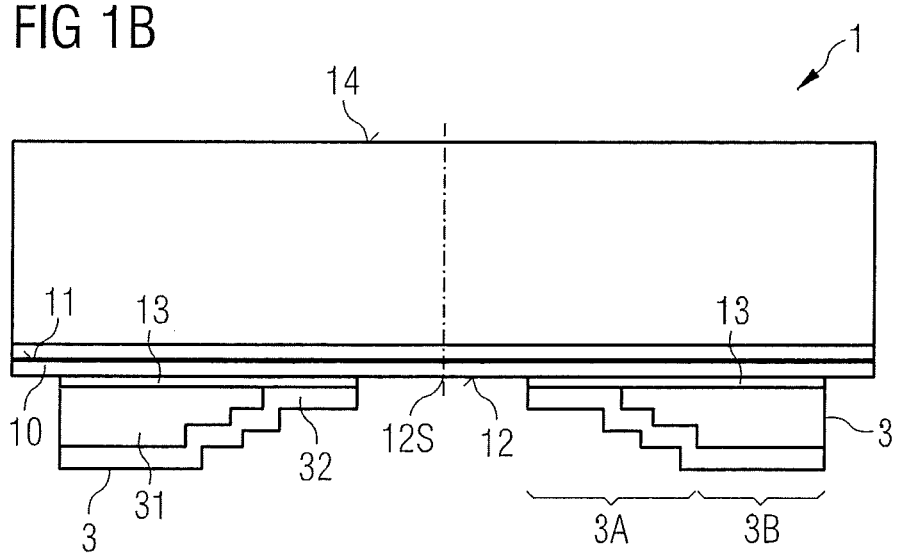

The example of FIG. 1B shows a semiconductor chip 1 in which the metal structures 31 of the solder pads 3 are formed from a plurality of metallic layers so that the metal structures 31 each have a staircase-shape. The layer of solder metal 32 on top reproduces the staircase-shape so that the solder pads 3 are themselves staircase-shaped. The thickness of the solder pads 3 increases monotonously in the direction away from the center 12S. The increase in the thickness of the solder pads 3 is chosen such that later curvatures of the semiconductor chip 1 during soldering onto a connection carrier are compensated so that the solder pads 3 are in contact with the connection points of the connection carrier in an area as large as possible.

Figure 1C:
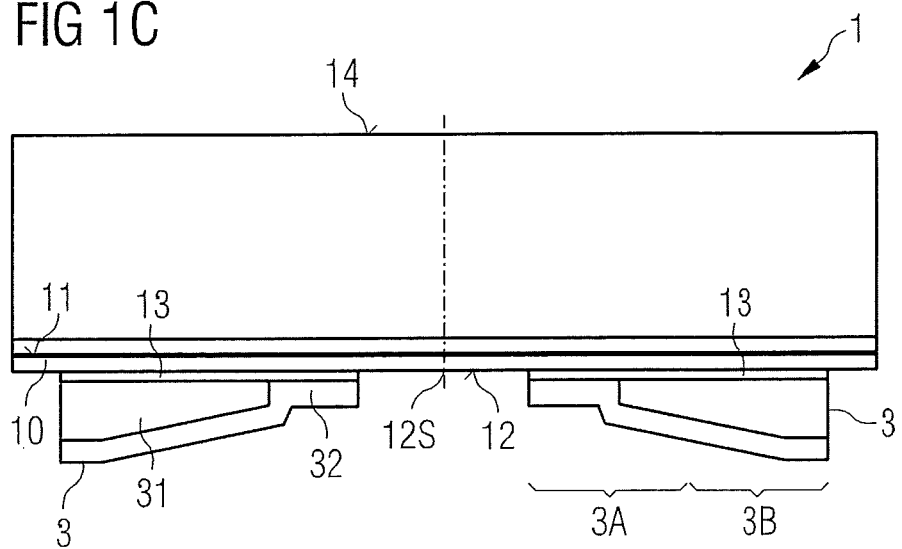

In the example of FIG. 1C, unlike in the example of FIG. 1B, the metal structures 31 of the solder pads 3 are not provided with a staircase-shape. Rather, in FIG. 1C, the metal structures 31 show a continuous increase in thickness in a direction away from the center 12S. With the layer of solder metal 32 placed on top, the solder pads 3 also show a continuous increase in thickness.

Figure 1D:
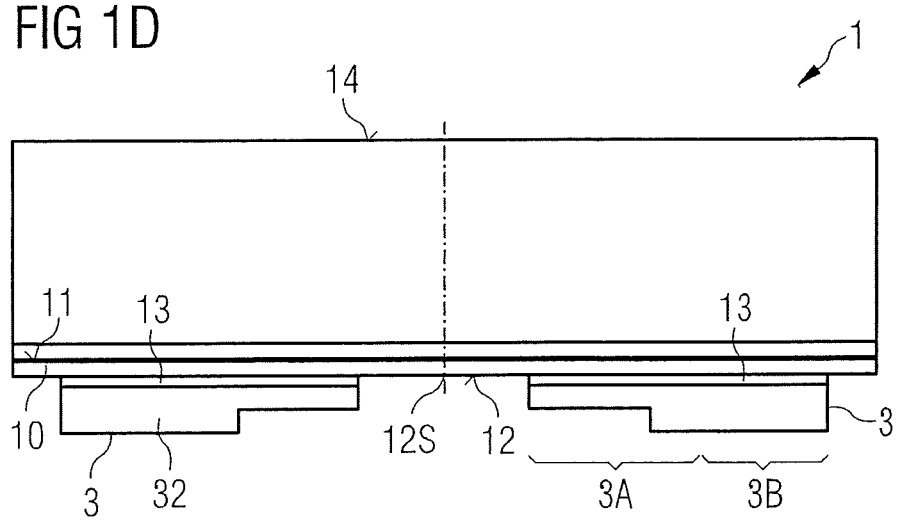

The example of FIG. 1D shows a semiconductor chip 1 in which a metal structure 31 made of a metal with a high melting point is dispensed with. The solder pads 3 consist entirely of a solder metal 32 that melt when soldered onto a connection carrier. The solder pads 3 formed in this way can also have a specifically varying thickness, particularly in the form of a staircase with two steps.

In the example of FIG. 1E, the solder pads 3 made of the solder metal 32 are formed as a staircase with more than two steps, the thickness of the solder pads 3 increasing again in the direction away from the center 12S.

FIG. 1F shows an example where the solder pads 3 are made of the solder metal 32 and their thickness increases continuously in the direction away from the center 12S.

In the example of FIG. 1G, the sapphire chip from FIG. 1A is replaced by a thin-film chip. But the structure of the solder pads 3 is identical.

FIG. 2 shows a connection carrier 2 in cross-sectional view. The connection carrier 2 has connection points 23 that, for example, are metallic. In the middle between the connection points 23, the upper side 22 has a center 22S. On the connection points 23 solder pads 3 are formed that correspond to the solder pads 3 from FIG. 1B. On average, the solder pads 3 are thicker further away from the center 22S than near the center 22S.

The compensation of the curvature of the semiconductor chip 1 or the connection carrier 2 occurring during the soldering process can thus be achieved by applying solder pads 3 of varying thickness to contact points 13 of the semiconductor chip 1 and/or to connection points 23 of the connection carrier 2.

Figure 3A:
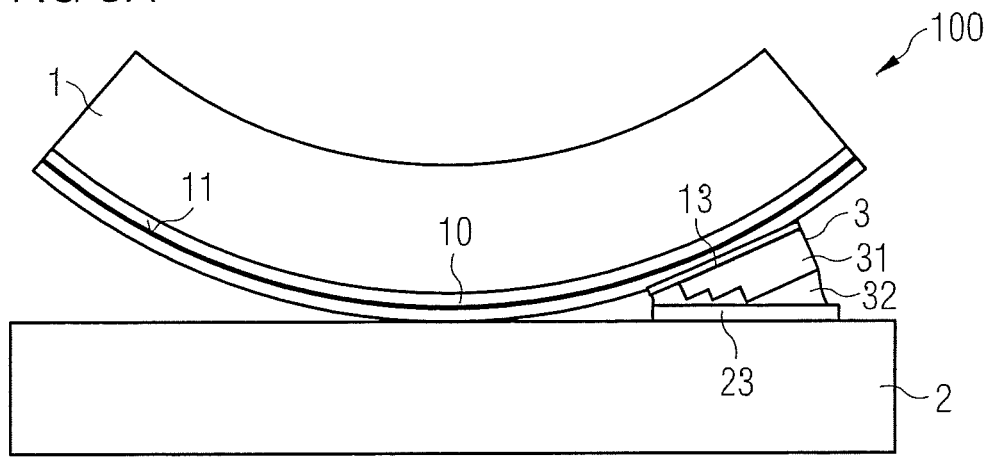
FIGS. 3A and 3B show examples of an optoelectronic component in a cross-sectional view.

FIG. 3A shows a cross-sectional view of an optoelectronic component 100. The component 100 was created, for example, by soldering a semiconductor chip 1 described in connection with FIG. 1B onto a connection carrier 2. The contact points 13 of the semiconductor chip 1 were electrically and mechanically connected to the connection points 23 of the connection carrier 2 via the solder pads 3. Due to the high heat generated during the soldering process, the semiconductor chip 1 has bent. As can be seen in 3A, the thickness variation of the solder pads 3 was chosen such that the curvature of the semiconductor chip 1 is partially compensated. In region where the distance between the rear side 12 of the semiconductor chip 1 and the upper side 22 of the connection carrier 2 is greater, the thickness of the solder pads 3 was also chosen to be greater. This ensures, as shown in FIG. 3A, that both the contact points 13 and the connection points 23 are covered and wetted in a large area by the solder pads 3, particularly by more than 80%. For reasons of clarity, FIG. 3A shows only one of the two contact points 13 with the assigned solder pad 3 and connection point 23.

Figure 3B:
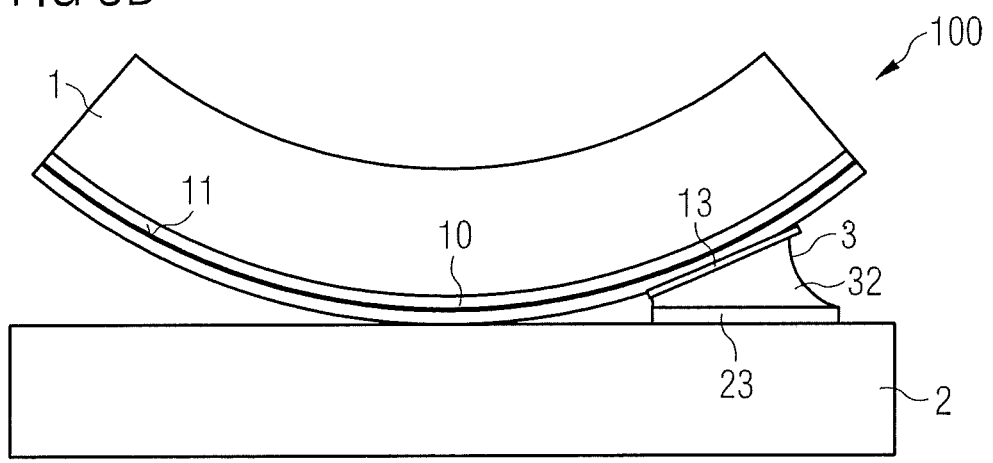

FIG. 3B shows a semiconductor chip 1, as shown in FIG. 1F, soldered onto a connection carrier 2. Also, the variation in the thickness of the solder pads 3 causes the curvature of the semiconductor chip 1 occurring during the soldering process to be at least partially compensated so that large-area wetting of both the contact point 13 and the connection point 23 is possible.

Figure 3C:
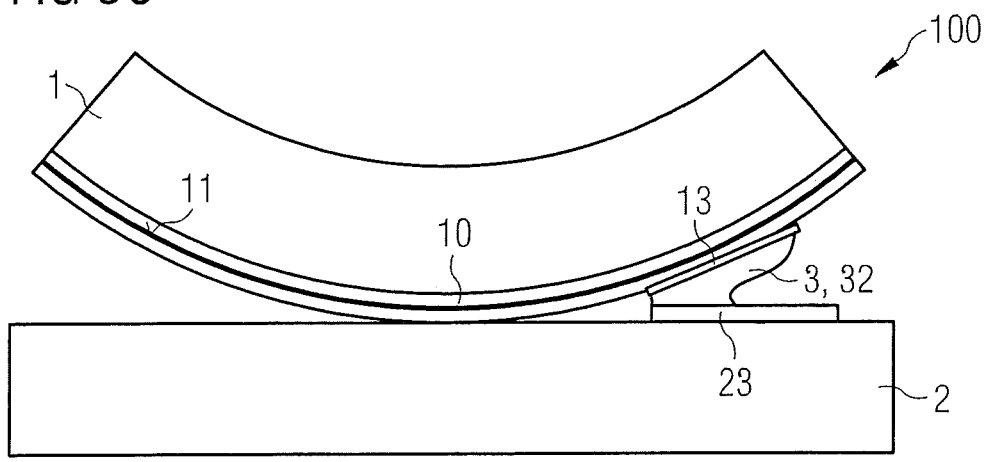
FIG. 3C shows an alternative of an optoelectronic component in a cross-sectional view.

FIG. 3C, on the other hand, shows an alternative component 100 where solder pads 3 without varying thickness are chosen. The shown solder pad 3, for example, had a constant thickness before the soldering process and was applied to the contact points 13 of the semiconductor chip 1. Due to the curvature of semiconductor chip 1 and connection carrier 2 during the soldering process, the distance between the semiconductor chip 1 and connection carrier 2 is no longer the same in the entire region of semiconductor chip 1. As a result, the solder material 32 did not wet all regions of the connection points 23. As a consequence, both the electrical and mechanical connection between contact point 13 and connection point 23 is less reliable and stable than in the exemplary embodiment of FIGS. 3A and 3B.

FIGS. 4A to 4E show examples of semiconductor chips 1 in a plan view of the rear sides 12. The two solder pads 3 on the rear side 12 are each divided into two equally sized regions 3A and 3B. The boundaries between the two regions 3A, 3B are marked by dashed lines. In this view, all points of the first region 3A are closer to the center 12S of the rear side 12 than the points of the second region 3B. The mean thickness of the solder pads 3 in the first region 3A is smaller than in the second region 3B. This is achieved in FIGS. 4A to 4E by the fact that the solder pads 3 comprise the metal structure 31 that covers the first region 3A to a lesser degree than the second region 3B. Both regions 3A, 3B are completely covered by the layer of solder metal 32. The areas over which the metal structure 31 runs are correspondingly thicker by the thickness of the metal structure 31 than the other areas of the solder pads 3.

The semiconductor chips 1 of FIGS. 4A to 4E differ only in the distribution of the metal structures 31. The solder pads 3 are rectangular in a plan view.

Figure 4A:
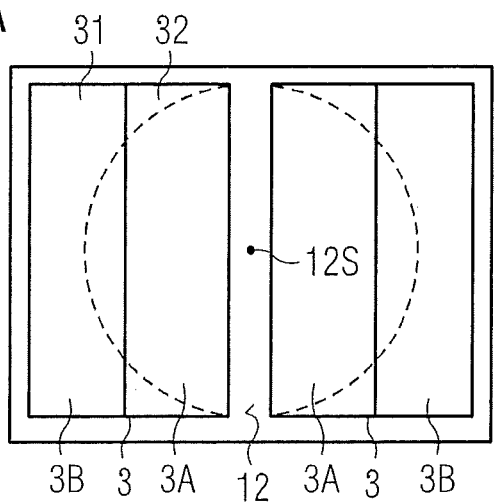
FIGS. 4A to 4E show examples of a semiconductor chip in a plan view on the rear side.

In FIG. 4A, the metal structures 31 each approximately form half of the solder pads 3 when viewed in a plan view. The metal structures 31 each form a half of the solder pads 3 facing away from the center 12S.

Figure 4B:
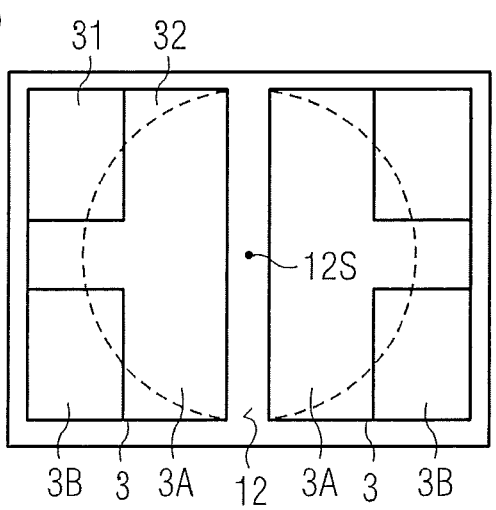

In FIG. 4B, two metal structures 31 are used per solder pad 3, each of which is arranged at the corners of the solder pad 3 facing away from the center 12S.

Figure 4C:
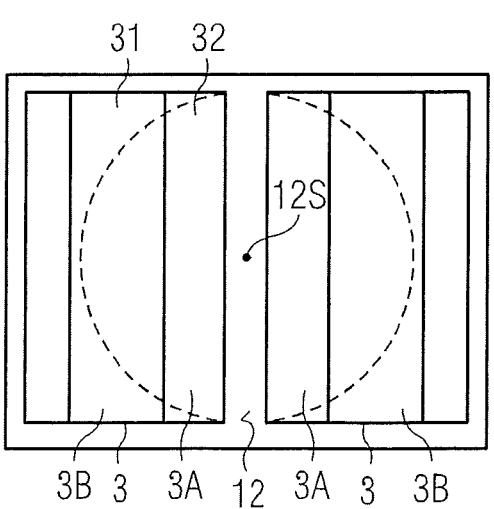
Figure 4D:
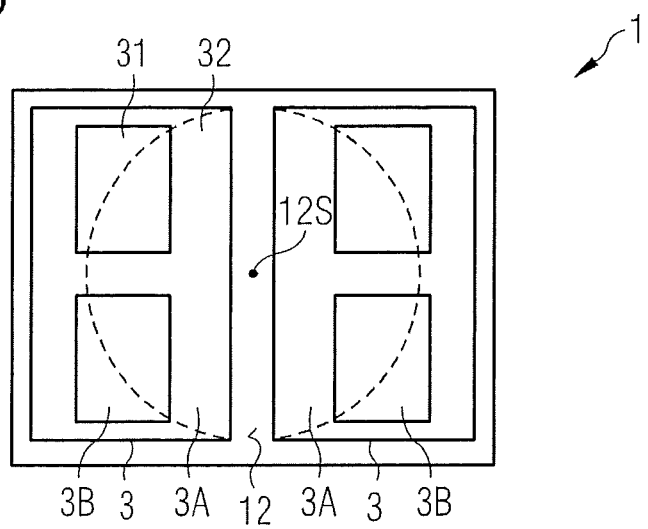

In FIGS. 4C and 4D the solder pads are similar to those in FIGS. 4A and 4B, except that the metal structures 31 are each offset towards the center 12S so that the thickness of the solder pads 3 at the outer edges of the solder pads 3 is less than inside the solder pads 3.

Figure 4E:
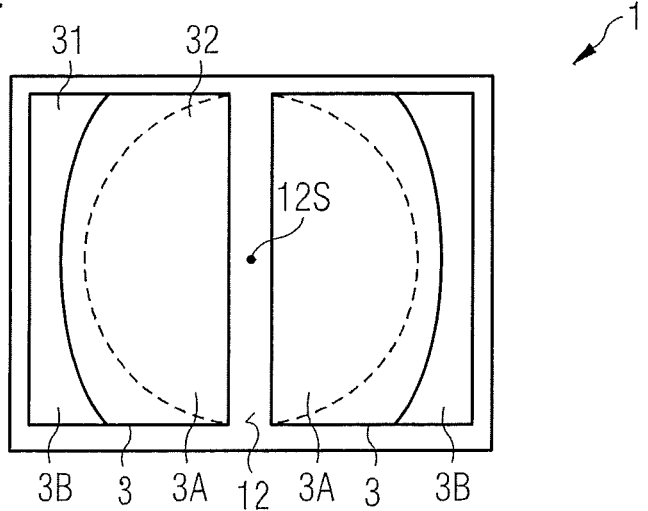

In FIG. 4E, the metal structure 31 is again drawn to the edges of the solder pads 3 furthest away from the center 12S. In addition, the edge of the metal structures 31 facing the center 12S each have a concave curvature.

The thickness variation of the solder pads 3 in the FIGS. 4A to 4E are each formed by a metal structure 31 formed as a layer with a layer of solder metal 32 drawn over it and covering the entire solder pads 3. However, in FIGS. 4A to 4E, the thickness variations can also be formed differently, for example, by varying the thickness of the solder metal 32 itself as, for example, shown in FIG. 1D. A continuous or staircase-shaped increase of the thickness of the solder pads 3 is also possible.

This application claims the priority of DE 10 2016 121 631.3, the subject matter of which is incorporated herein by reference.

Our solder pads, methods and components described herein are not limited by the description in conjunction with the examples. Rather, this disclosure comprises any new feature as well as any combination of features, particularly including any combination of features in the appended claims, even if the feature or combination per se is not explicitly stated in the claims or examples.

The invention claimed is:

1. An optoelectronic semiconductor chip comprising:
a rear side with a center and with two contact points for electrical contacting of the semiconductor chip, said contact points being spaced apart from one another, and
two solder pads arranged on the contact points, wherein the center is located in a region between the contact points,
the solder pads protrude from the rear side and are exposed, and
on average, the solder pads are thicker further away from the center than in the vicinity of the center or vice versa, wherein
a thickness of the solder pads is varied across a lateral extent of the solder pads in a predetermined manner in an unmounted state, and
a variation in thickness is adapted to a curvature of the rear side expected when the semiconductor chip is soldered onto a connection carrier such that the thickness of the solder pads is selected to be greater in regions in which a distance between the rear side and the connection carrier caused by the expected curvature will be greater.

2. The optoelectronic semiconductor chip according to claim 1, wherein
in a plan view of the rear side, each solder pad consists of two equally sized regions,
each point of the first region is closer to the center than each point of the second region,
a mean thickness of the solder pads in the second region is larger than a mean thickness in the first region or vice versa, and
each of the smaller of the two mean thicknesses is at most 70% of the larger of the two mean thicknesses.

3. The optoelectronic semiconductor chip according to claim 2,
wherein the thickness averaged over the respective first region deviates at most by 15 µm and at least by 1 µm from the thickness averaged over the associated second region.

4. The optoelectronic semiconductor chip according to claim 1, wherein
at least one of the solder pads comprises a metal structure and a solder metal,
the metal structure is arranged between a layer of the solder metal and the rear side,
the metal structure has a melting temperature which is above the melting temperature of the solder metal.

5. The optoelectronic semiconductor chip according to claim 4, wherein
the metal structure is a layer covering the rear side in the second region and having a constant thickness within manufacturing tolerance,
the first region is free of the metal structure or covered to a lesser degree by the metal structure than the second region, and
the layer of the solder metal extends over the first region and the second region.

6. The optoelectronic semiconductor chip according to claim 4, wherein
the metal structure is staircase-shaped so that the thickness of the metal structure increases or decreases stepwise in the lateral direction and has at least two steps,
in a region of each step, the thickness of the metal structure is constant within manufacturing tolerance, and
the thickness of the metal structure in the region of each step is not more than 90% of the thickness of the metal structure in the region of the next larger step.

7. The optoelectronic semiconductor chip according to claim 4,
wherein a thickness of the metal structure continuously increases or decreases in a lateral direction.

8. The optoelectronic semiconductor chip according to claim 4, wherein
the metal structure comprises or consists of one or more of: Au, Ag, Ni and Cu, and
the solder metal comprises or consists of one or more of: AuSn, AgSn, NiSn and Au.

9. The optoelectronic semiconductor chip according to claim 1,
wherein at least one solder pad is staircase-shaped so that the thickness of the solder pad increases or decreases stepwise in the lateral direction and the solder pad has at least two steps.

10. The optoelectronic semiconductor chip according to claim 1,
wherein, for least one solder pad, the thickness of the solder pad continuously increases or decreases in the lateral direction.

11. The optoelectronic semiconductor chip according to claim 1,
wherein at least one solder pad is formed of a solder metal.

12. The optoelectronic semiconductor chip according to claim 4,
wherein each solder pad has two or more metal structures spaced apart from one another.

13. The optoelectronic semiconductor chip according to claim 1, wherein the two contact points have different polarities.

14. A connection carrier for mounting a semiconductor chip comprising:
an upper side with two adjacent connection points for electrical contacting of the semiconductor chip, said connection points being spaced apart from one another,
a center on the upper side between the connection points, and
two solder pads arranged on the connection points, wherein
the solder pads protrude from the upper side and are exposed,
on average, the solder pads are thicker further away from the center than in the vicinity of the center or vice versa, wherein
a thickness of the solder pads is varied across a lateral extent of the solder pads in a predetermined manner in an unmounted state, and
a variation in thickness is adapted to a curvature of a rear side expected when the semiconductor chip is soldered onto the connection carrier such that the thickness of the solder pads is selected to be greater in regions in which a distance between the rear side and the connection carrier caused by the expected curvature will be greater.

15. A method of manufacturing an optoelectronic component comprising:

A) providing an optoelectronic semiconductor chip and/or a connection carrier, wherein the semiconductor chip has two contact points on a rear side, and the connection carrier has at least two connection points on an upper side; and B) applying solder pads to the connection points and/or to the contact points, wherein a thickness of the solder pads related to a normal of the upper side or the rear side is varied over the lateral expansion of the solder pads so that the thickness of the solder pads is adapted to a curvature of the rear side and the upper side occurring in a subsequent soldering process, wherein, in regions in which, due to the later curvature, the expected distance between the rear side and the upper side is larger or smaller, the thickness of the solder pads is also selected to be correspondingly larger or smaller, wherein a thickness of the solder pads is varied across a lateral extent of the solder pads in a predetermined manner in an unmounted state, and a variation in thickness is adapted to a curvature of a rear side expected when the semiconductor chip is soldered onto the connection carrier such that the thickness of the solder pads is selected to be greater in regions in which a distance between the rear side and the connection carrier caused by the expected curvature will be greater.

16. The method according to claim 15, further comprising:

C) electrical and mechanical connecting the semiconductor chip and the connection carrier by a soldering process in which the rear side and/or the upper side are curved, wherein each connection point is uniquely assigned to a contact point, and the contact points connect to the connection points via the solder pads.

17. An optoelectronic component comprising:

a semiconductor chip having a rear side and two contact points for electrical contacting of the semiconductor chip, said contact points being arranged on the rear side and spaced apart from one another, and a connection carrier having an upper side and two connection points for electrical contacting of the semiconductor chip, said connection points being arranged on the upper side and spaced apart from one another, wherein the semiconductor chip is soldered onto the connection carrier, the contact points electrically and mechanically connect to assigned connection points via solder pads, the rear side and/or the upper side have a curvature with a radius of curvature of at least 1 cm so that a distance between the upper side and the rear side monotonously increases or decreases in the direction away from a center of the rear side, the solder pads are in direct mechanical contact with the connection points and the contact points, the solder pads wet at least 80% of the connection points and the contact points, and the thickness of the solder pads increases or decreases monotonously in the direction away from the center of the rear side according to the distance, at least one of the solder pads comprises a metal structure and a solder metal, the metal structure is arranged between a layer of the solder metal and the rear side, the metal structure has a melting temperature above the melting temperature of the solder metal, and a thickness of the metal structure increases or decreases in a lateral direction.

* * * * *